United States Patent
Hoentschel et al.

(10) Patent No.: US 8,936,977 B2
(45) Date of Patent: Jan. 20, 2015

(54) LATE IN-SITU DOPED SIGE JUNCTIONS FOR PMOS DEVICES ON 28 NM LOW POWER/HIGH PERFORMANCE TECHNOLOGIES USING A SILICON OXIDE ENCAPSULATION, EARLY HALO AND EXTENSION IMPLANTATIONS

(75) Inventors: Jan Hoentschel, Dresden (DE); Shiang Yang Ong, Dresden (DE); Stefan Flachowsky, Dresden (DE); Thilo Scheiper, Dresden (DE)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/482,393

(22) Filed: May 29, 2012

(65) Prior Publication Data

US 2013/0320449 A1 Dec. 5, 2013

(51) Int. Cl.
*H01L 21/338* (2006.01)
(52) U.S. Cl.
USPC .......................................... 438/184; 438/151
(58) Field of Classification Search
CPC .............. H01L 27/088; H01L 21/8238; H01L 29/6656
USPC .................. 257/192, 368, E29.255, E21.626; 438/151, 184, 230, 240
See application file for complete search history.

(56) References Cited

U.S. PATENT DOCUMENTS

| | | | | |
|---|---|---|---|---|
| 2011/0024840 | A1* | 2/2011 | Khater | 257/347 |
| 2011/0042751 | A1* | 2/2011 | Kim et al. | 257/369 |
| 2011/0104863 | A1* | 5/2011 | Beyer et al. | 438/283 |
| 2012/0001228 | A1* | 1/2012 | Chong et al. | 257/190 |
| 2012/0056245 | A1* | 3/2012 | Kang et al. | 257/192 |
| 2012/0153399 | A1* | 6/2012 | Hoentschel et al. | 257/369 |
| 2012/0193708 | A1* | 8/2012 | Flachowsky et al. | 257/335 |
| 2012/0299103 | A1* | 11/2012 | Cheng et al. | 257/347 |
| 2013/0065367 | A1* | 3/2013 | Flachowsky et al. | 438/231 |
| 2013/0270642 | A1* | 10/2013 | Hook | 257/351 |

* cited by examiner

*Primary Examiner* — Jarrett Stark
*Assistant Examiner* — Shahed Ahmed
(74) *Attorney, Agent, or Firm* — Ditthavong & Steiner, P.C.

(57) ABSTRACT

A HKMG device with PMOS eSiGe source/drain regions is provided. Embodiments include forming first and second HKMG gate stacks on a substrate, forming a nitride liner and oxide spacers on each side of each HKMG gate stack, performing halo/extension implants at each side of each HKMG gate stack, forming an oxide liner and nitride spacers on the oxide spacers of each HKMG gate stack, forming deep source/drain regions at opposite sides of the second HKMG gate stack, forming an oxide hardmask over the second HKMG gate stack, forming embedded silicon germanium (eSiGe) at opposite sides of the first HKMG gate stack, and removing the oxide hardmask.

14 Claims, 9 Drawing Sheets

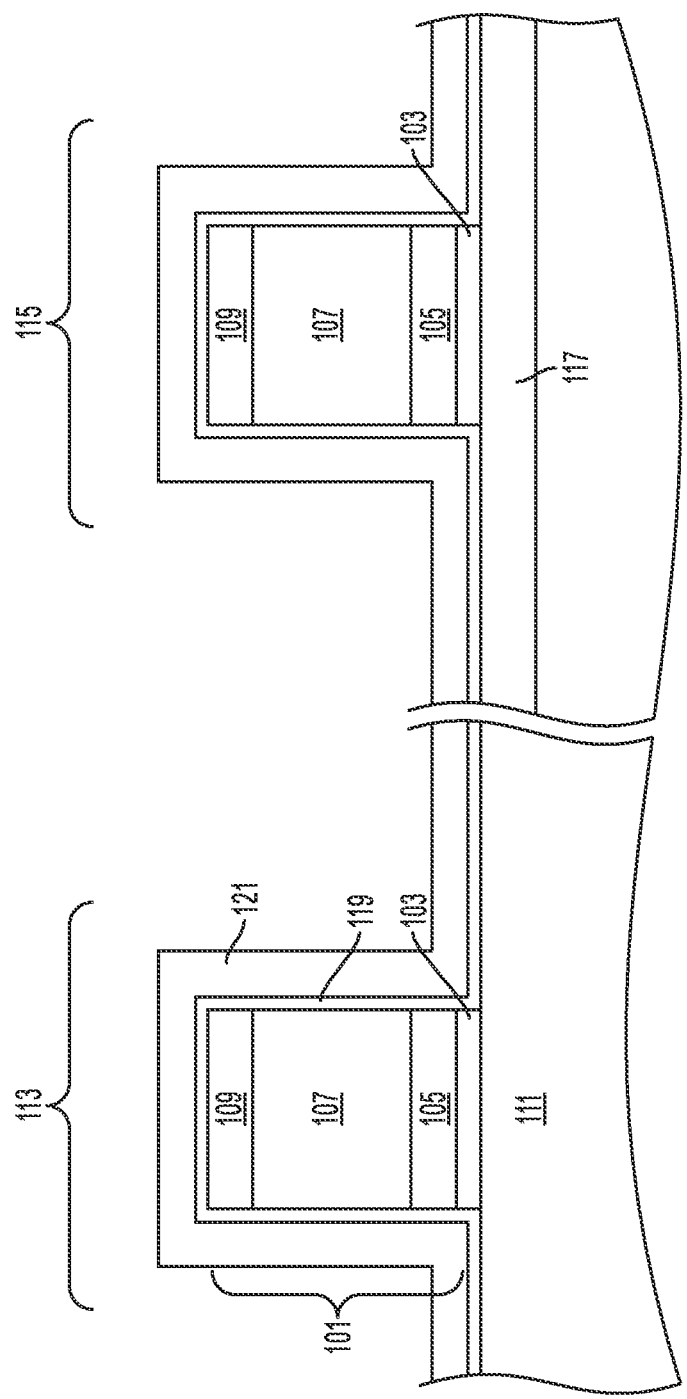

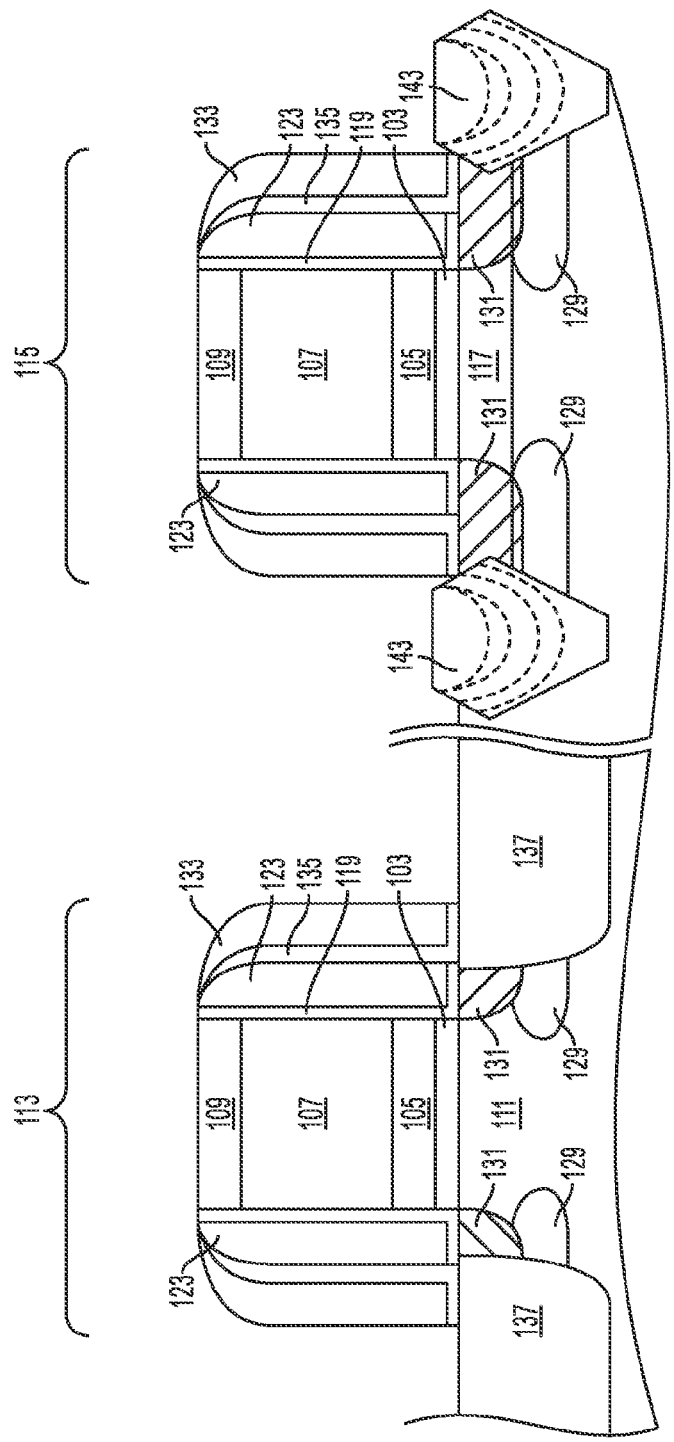

LATE IN-SITU DOPED SIGE JUNCTIONS FOR PMOS DEVICES ON 28 NM LOW POWER/HIGH PERFORMANCE TECHNOLOGIES USING A SILICON OXIDE ENCAPSULATION, EARLY HALO AND EXTENSION IMPLANTATIONS

TECHNICAL FIELD

The present disclosure relates to high-k metal gate (HKMG) semiconductor device with embedded silicon germanium (SiGe) source/drain regions. The present disclosure is particularly applicable to 28 nanometer (nm) super-low-power (28SLP) technologies.

BACKGROUND

In the current mobile/multimedia market, there is a great need for long standby time, or rather, low leakage products. The 28SLP process was originally designed to meet that need. However, there is also a demand for higher performance with low power consumption. The drive for high performance requires high speed operation of microelectronic components requiring high drive currents. Typically, the structural and doping parameters tending to provide a desired increase in drive current adversely impact leakage current. High-k metal gate (HKMG) electrodes have evolved for improving the drive current by reducing polysilicon depletion.

In modern CMOS technologies, embedded silicon germanium (SiGe) source/drain areas are standard in PFET devices as they improve performance by introducing uniaxial strain into the channel. However, to date the 28SLP process does not include an embedded source/drain stressor such as SiGe in the p-active source/drain regions and therefore is lacking in performance due to lower hole mobility.

A need therefore exists for methodology enabling fabrication of an SLP device with high performance by incorporating SiGe into an HKMG process, and the resulting device.

SUMMARY

An aspect of the present disclosure is an in-situ-doped late SiGe (after all implants in the process flow) process flow for forming a HKMG CMOS device with embedded SiGe (eSiGe) in the PMOS.

Another aspect of the present disclosure is a HKMG CMOS device with embedded SiGe in the PMOS formed by a late SiGe process flow.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming first and second high-k metal gate (HKMG) gate stacks on a substrate; forming a nitride liner and oxide spacers on each side of each of the first and second HKMG gate stacks; performing halo/extension implants at each side of each of the first and second HKMG gate stacks; forming an oxide liner and nitride spacers on the oxide spacers of each of the first and second HKMG gate stacks; forming deep source/drain regions at opposite sides of the second HKMG gate stack; forming an oxide hardmask over the second HKMG gate stack; forming embedded silicon germanium (eSiGe) at opposite sides of the first HKMG gate stack; and removing the hardmask.

Aspects of the present disclosure include forming the nitride liner of silicon nitride (SiN); forming the oxide spacers of $SiO_2$; and forming the nitride spacers of SiN. Further aspects include the first and second HKMG gate stacks each including a high-k dielectric, a work function metal, polysilicon (poly-Si), and a SiN cap. Other aspects include precleaning prior to forming the eSiGe; and optimizing the precleaning to protect the $SiO_2$ spacers. Another aspect includes forming eSiGe at each side of the first HKMG gate stack by: forming a cavity by wet etching with tetramethylammonium hydroxide (TMAH); and epitaxially growing SiGe in the cavity. Additional aspects include implanting a boron dopant in-situ into the eSiGe, for example with a graded doping profile. Further aspects include annealing to activate implanted dopants after forming the oxide hardmask. Another aspect includes removing oxide hardmask by wet etching with diluted hydrofluoric acid (dHF). Other aspects include removing the SiN cap and nitride spacers after removing the oxide hardmask. Additional aspects include removing the SiN cap and nitride spacer by a dry or wet etch process. Further aspects include forming a silicide on the source/drain regions, the eSiGe, and the first and second HKMG gate stacks. Another aspect includes forming a channel SiGe region below the first HKMG gate stack.

Another aspect of the present disclosure is a device comprising: first and second high-k dielectric metal gate (HKMG) gate stacks, each comprising a high-k dielectric, a work function metal, and polysilicon (poly-Si); a nitride liner and first and second oxide spacers successively formed on each side of each of the first and second HKMG gate stacks; halo and extension regions at opposite sides of each of the first and second HKMG gate stacks formed prior to the second oxide spacers; deep source/drain regions at opposite sides of the second gate HKMG gate stack formed after the second oxide spacers; and embedded silicon germanium (eSiGe) at opposite sides of the first HKMG gate stack, formed after the deep source/drain regions using a hardmask over the second gate stack.

Aspects include first and second high-k dielectric metal gate (HKMG) gate stacks, each comprising a high-k dielectric, a work function metal, and polysilicon (poly-Si); a nitride liner and first and second oxide spacers successively formed on each side of each of the first and second HKMG gate stacks; halo and extension regions at opposite sides of each of the first and second HKMG gate stacks formed prior to the second oxide spacers; deep source/drain regions at opposite sides of the second gate HKMG gate stack formed after the second oxide spacers; and embedded silicon germanium (eSiGe) at opposite sides of the first HKMG gate stack, formed after the deep source/drain regions using a hardmask over the second gate stack. Further aspects include nitride spacers being formed over the second oxide spacers, and the deep source/drain regions at opposite sides of the second gate HKMG gate stack being formed using the nitride spacers as a soft mask. Another aspect includes the nitride liner and nitride spacers being silicon nitride (SiN) and the oxide spacers being silicon dioxide ($SiO_2$). Additional aspects include the eSiGe being doped in-situ with boron having a graded doping profile. Other aspects include a silicide on the eSiGe, the deep source/drain regions, and the first and second HKMG gate stacks. Another aspect includes a channel SiGe region below the first HKMG gate stack.

Another aspect of the present disclosure is a method including: forming PMOS and NMOS high-k metal gate (HKMG) gate stacks on a substrate; forming an L-shaped silicon nitride (SiN) liner and silicon dioxide (SiO$_2$) spacers on each side of each of the PMOS and NMOS HKMG gate stacks; performing halo/extension implants at each side of each of the PMOS and NMOS HKMG gate stacks; forming an L-shaped SiO$_2$ liner and SiN spacers on the SiO$_2$ spacers of each of the PMOS and NMOS HKMG gate stacks; implanting deep source/drain regions at opposite sides of the NMOS HKMG gate stack; forming an SiO$_2$ hardmask over the NMOS HKMG gate stack; forming embedded silicon germanium (eSiGe) at opposite sides of the PMOS HKMG gate stack by: forming a cavity at each side of the PMOS HKMG gate stack by wet etching with TMAH, epitaxially growing SiGe in the cavity, and implanting a boron dopant, with a graded doping profile, in-situ into the eSiGe concurrently with the epitaxial growth; wet etching the SiO$_2$ hardmask with diluted hydrofluoric acid (dHF); dry or wet etching the SiN cap and SiN spacers; and forming a silicide on the source/drain regions, the eSiGe, and the PMOS and NMOS HKMG gate stacks.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the FIGURES of the accompanying drawing and in which like reference numerals refer to similar elements and in which:

FIGS. 1A through 1I schematically illustrate a process flow for forming a semiconductor device with PMOS embedded SiGe source/drain regions, in accordance with an exemplary embodiment.

DETAILED DESCRIPTION

Figure 1B:
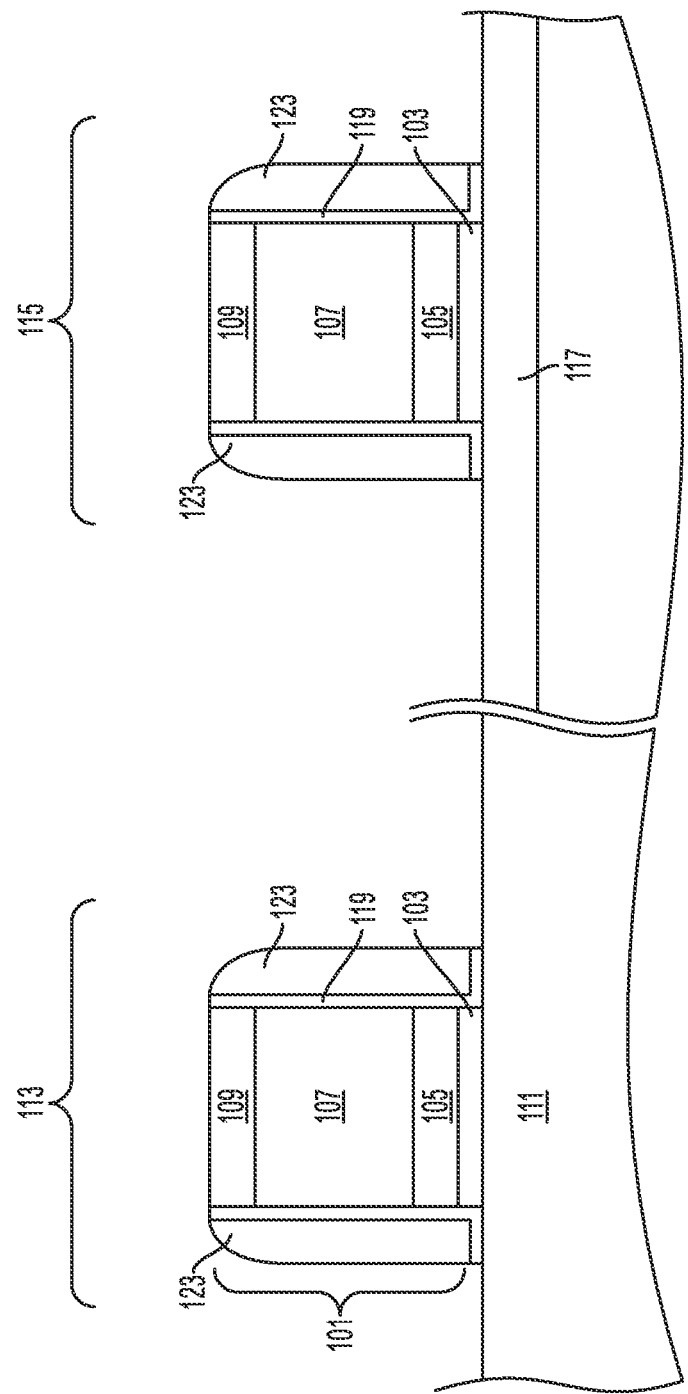
Figure 1C:
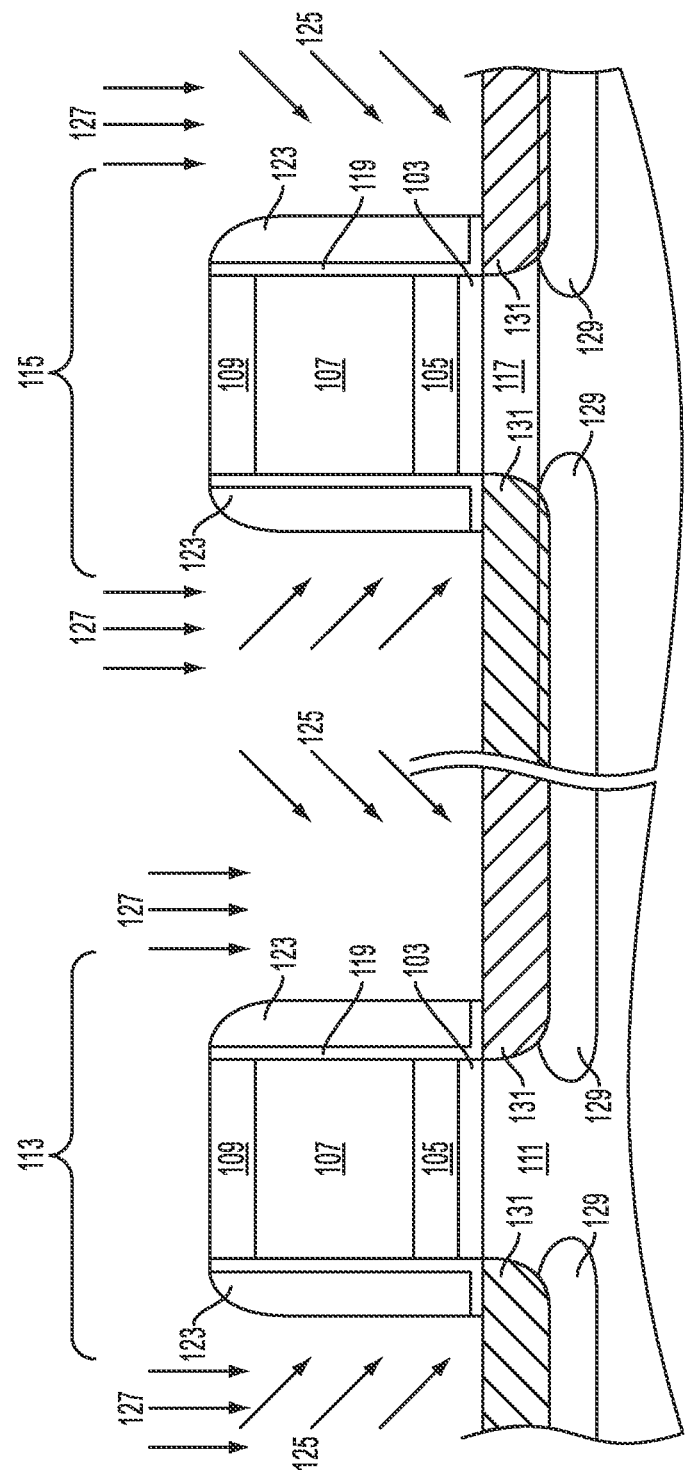

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of insufficient encapsulation of the gate first HKMG, attendant upon forming eSiGe source/drain regions in PMOS devices. In accordance with embodiments of the present disclosure, a late SiGe approach is incorporated into an HKMG process, improving yield, with higher PFET performance. More specifically, a nitride liner, oxide spacers, an oxide liner, and nitride spacers are formed to encapsulate the gate during various implantations, an oxide hardmask is formed over the NMOS gate stack after all implantations are complete, and eSiGe is epitaxially grown in cavities formed on opposite sides of the PMOS.

Methodology in accordance with embodiments of the present disclosure includes forming first and second high-k metal gate (HKMG) gate stacks on a substrate, forming a nitride liner and oxide spacers on each side of each of the first and second HKMG gate stacks, performing halo/extension implants at each side of each of the first and second HKMG gate stacks, forming an oxide liner and nitride spacers on the oxide spacers of each of the first and second HKMG gate stacks, forming deep source/drain regions at opposite sides of the second HKMG gate stack, forming an oxide hardmask over the second HKMG gate stack, forming embedded silicon germanium (eSiGe) at opposite sides of the first HKMG gate stack, and removing the hardmask.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A through 1I illustrate a process flow incorporating embedded SiGe in the PMOS, in accordance with an exemplary embodiment of the present disclosure. Adverting to FIG. 1A, a gate first HKMG stack 101, including high-k dielectric 103, for example hafnium oxide (HfO$_2$) or hafnium silicon oxynitride (HfSiON), work function metal 105, such as titanium nitride (TiN), poly-silicon (poly-Si) 107, and nitride cap 109, is shown on silicon substrate 111 for each of NMOS 113 and PMOS 115. PMOS 115 further includes channel SiGe (cSiGe) 117 to a thickness of 5 to 10 nm into substrate 111, below high-k dielectric 103, to adjust the threshold voltage due to the gate first approach. Using the gate first approach further requires an encapsulation layer around the gate stack to protect the HKMG from later process steps such as cleans and etches. For this purpose, a multilayer deposition (MLD) silicon nitride (Si$_3$N$_4$) layer 119 is blanket deposited over the entire substrate to a thickness of 3 nm to 6 nm. A low pressure tetra ethyl ortho silicate (LPTEOS)/high temperature oxide (HTO) oxide layer 121 is formed over Si$_3$N$_4$ MLD layer 119 to a thickness of 5 nm to 10 nm, for forming a spacer zero on each side of each gate stack.

As illustrated in FIG. 1B, oxide layer 121 is anisotropically etched to form SiO$_2$ spacers (SP0) 123. MLD Si$_3$N$_4$ layer 119 is also etched from the open active areas. The spacers are used to offset and adjust halo/extension implants (125/127) in forming halo regions 129 and extension regions 131, shown in FIG. 1C, for both the NMOS and PMOS, using an implant mask for each (not shown for illustrative convenience). Halo regions are formed by implanting a low to medium dose (e.g., 3.5E13 to 7E13) of arsenic (As), boron (B), or boron fluoride (BF$_2$) at a medium energy (for example 35 keV to 50 keV). Extension regions are formed by implanting a high dose (e.g. 1.1E15) of AS, B, or BF$_2$ at a low energy (for example 0.7 keV for B or 4 keV for As).

Figure 1D:
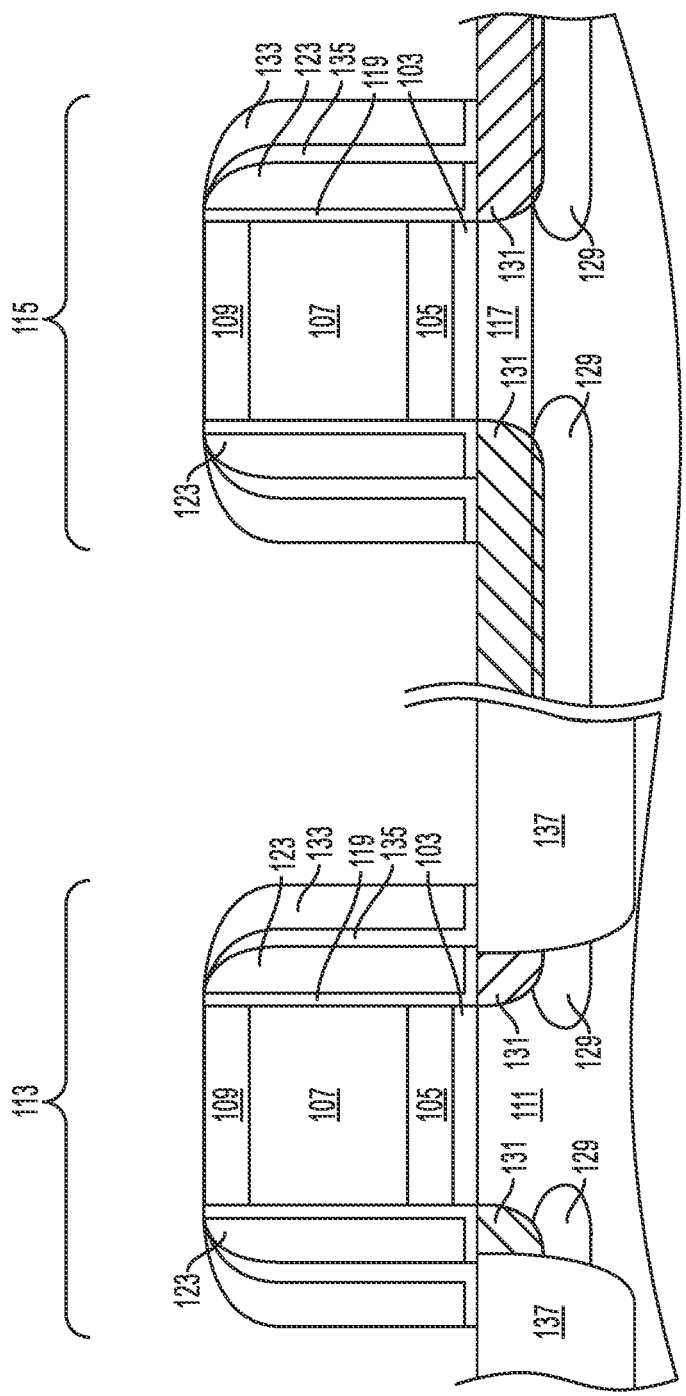

Adverting to FIG. 1D, a nitride spacer 133, for example SiN, is formed on both the NMOS and the PMOS, with an oxide liner 135 underneath to act as an etch stop. Nitride spacers 133 are used as a soft mask for deep source/drain implants in the NMOS, for forming deep source/drain regions 137. For example, As, B, or BF$_2$ may be implanted at a high dose (e.g., 2E15) and high energy (e.g., 6 keV for B or 20 keV for As).

Figure 1E:
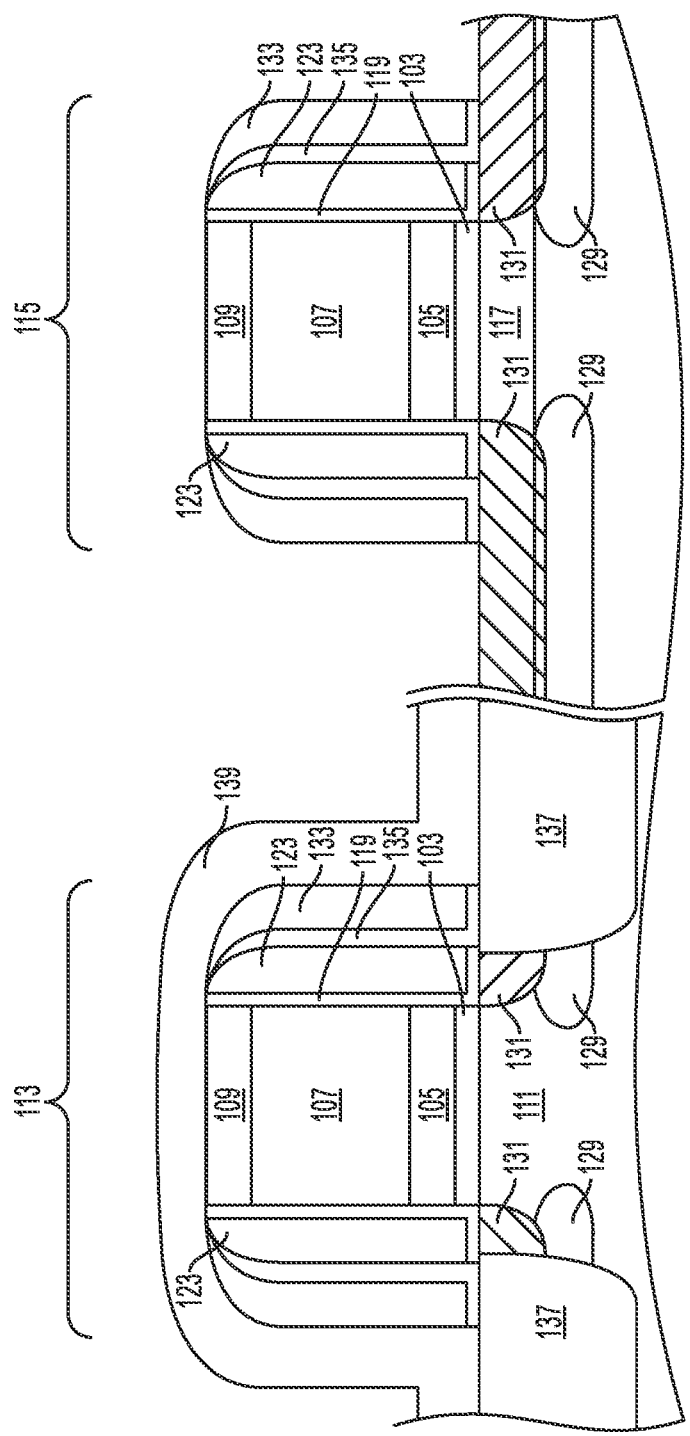

Subsequently, as illustrated in FIG. 1E, an oxide layer 139 is deposited to a thickness of 10 nm to 25 nm over NMOS 113. Oxide layer 139 may be formed over NMOS 113 and PMOS 115, and then cleared from PMOS 115. The oxide layer acts as a hardmask over NMOS 113. Next a rapid thermal anneal (RTA) is performed to activate the dopants and anneal all implant damages. The RTA simultaneously hardens hardmask 139 through trough densification. Alternatively, the RTA may be performed directly after the n-type deep source/drain implant, and thus before formation of the oxide hardmask 139.

Figure 1F:
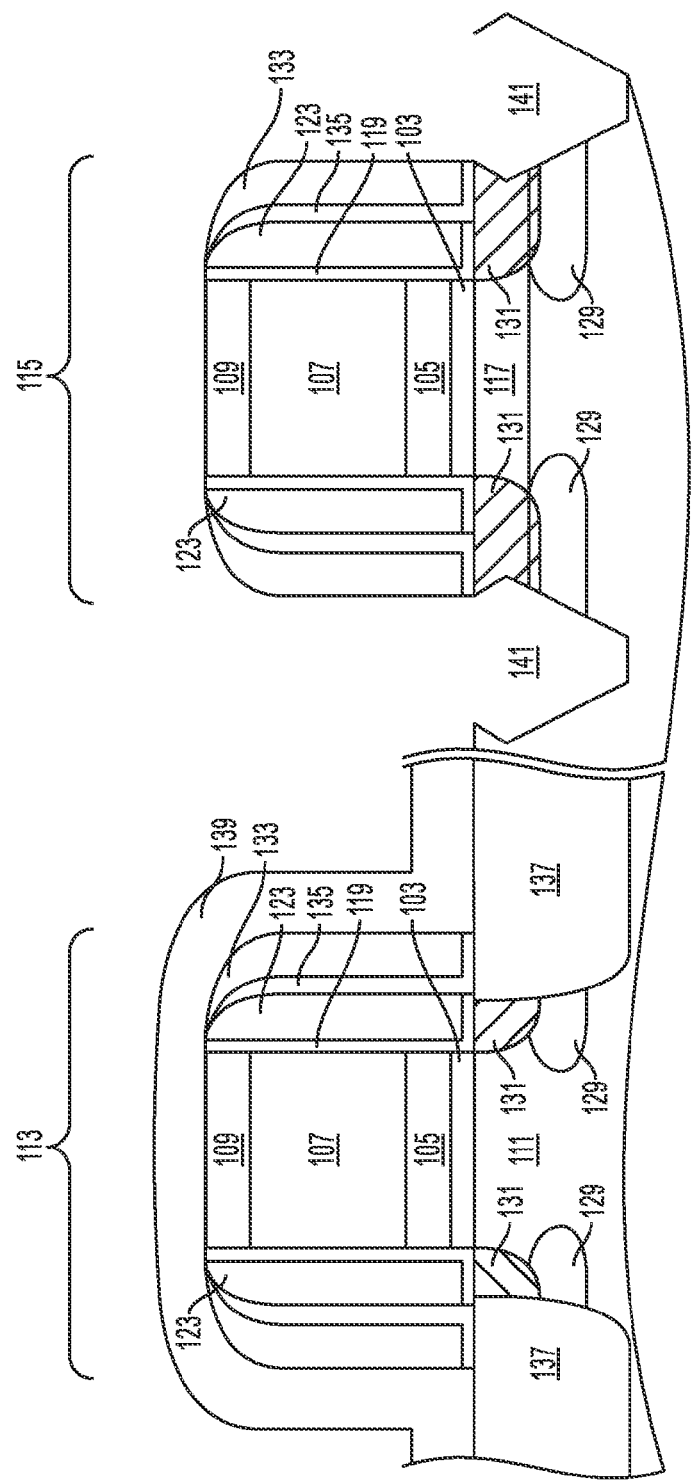

As illustrated in FIG. 1F, a sigma shaped cavity 141 is formed using tetramethylammonium hydroxide (TMAH) in the substrate on each side of the PMOS 115 gate stack. Although other shapes are possible, the sigma shaped cavity 141 allows very close proximities and therefore maximum stress inside the transistor channel region. Before further processing, a preclean is performed that is optimized (i.e., not very aggressive) to protect the oxide hardmask 139.

Figure 1G:
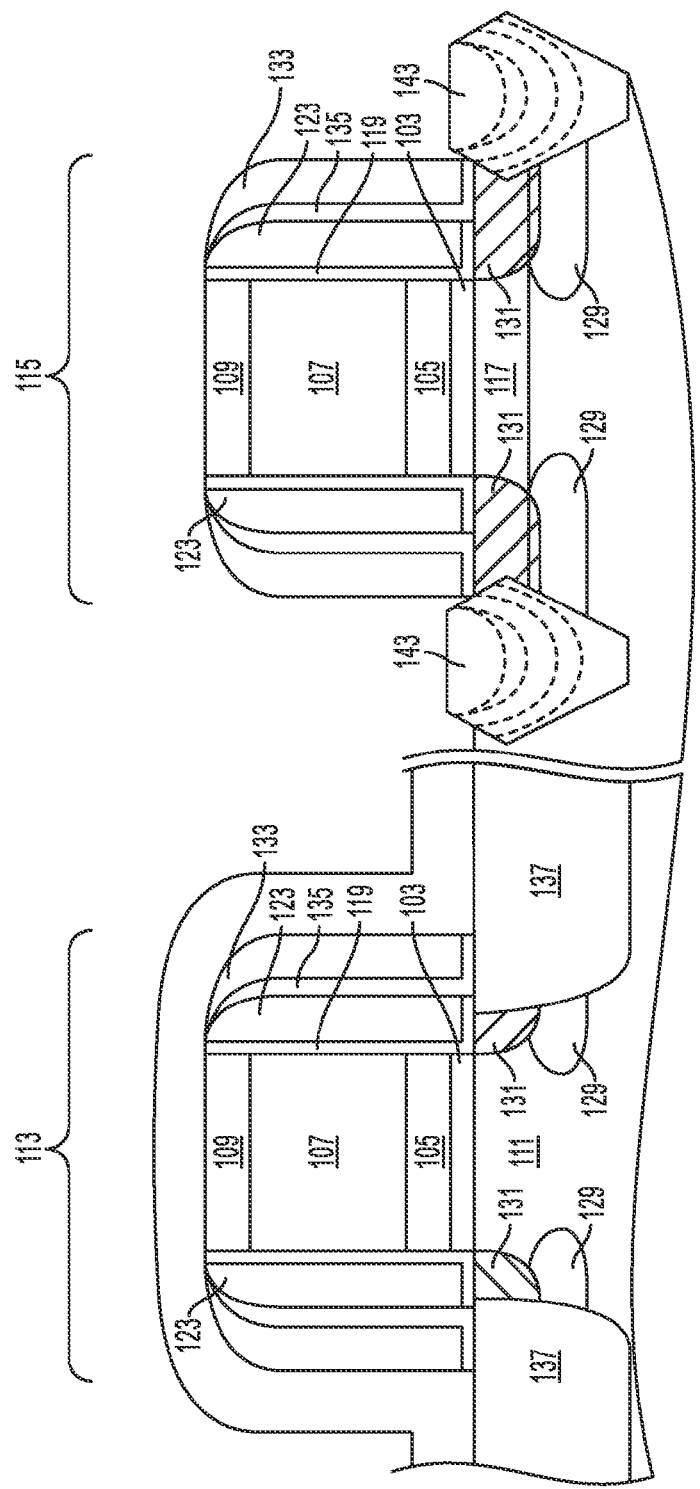
Figure 1I:
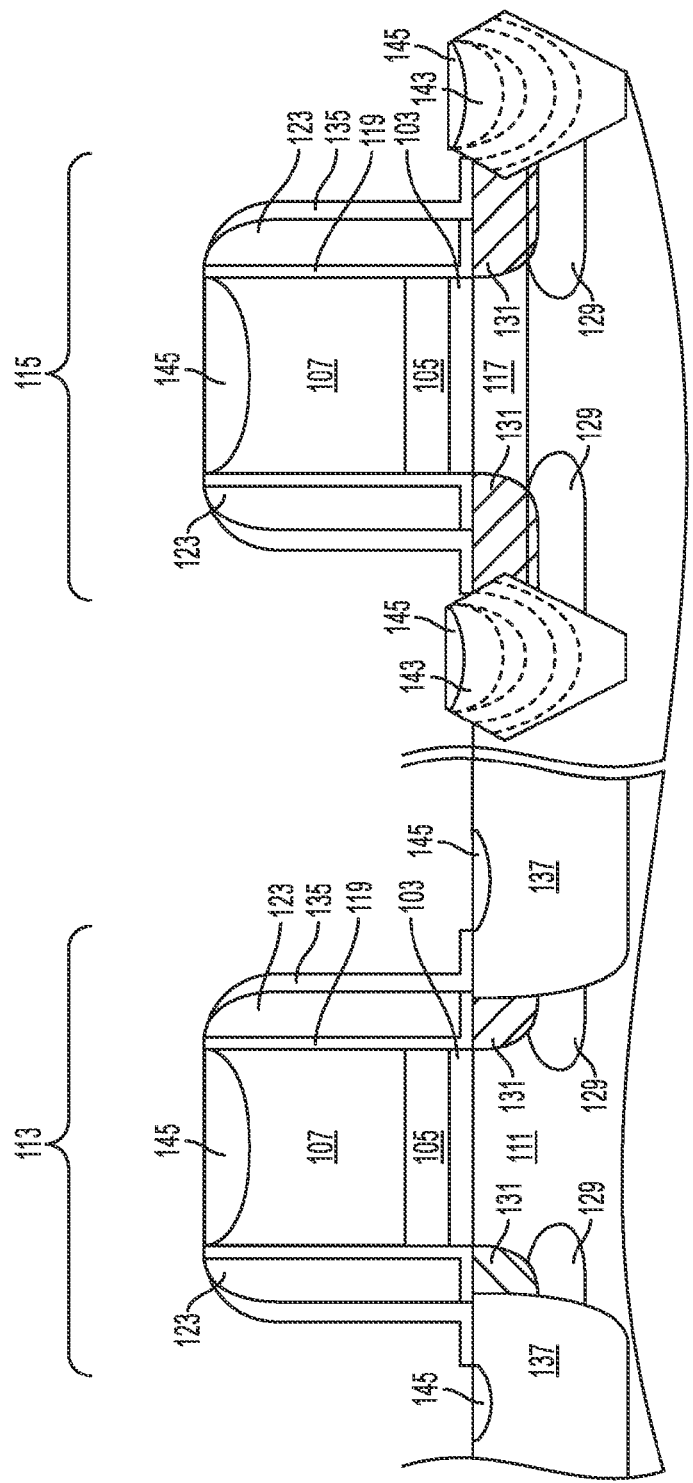

After the preclean, as illustrated in FIG. 1G, SiGe 143 is grown in the cavities 141, for example by a low-pressure chemical vapor deposition (LPCVD) process as an in-situ graded boron doped deposition for the deep source/drain areas of the PMOS device. In-situ doping is employed to allow high and uniform doping levels, which in turn reduces parasitic resistance and contact resistance, thereby allowing higher drive currents. In addition, the boron allow the germanium content to be increased, e.g. to greater than 35%, as opposed to 25% for undoped SiGe, which induces higher stresses and further improves hole mobility enhancement. By doping the source/drain regions of the PMOS during the epitaxy, a dedicated source/drain implantation is eliminated, thereby saving process costs for masks and implantation, reducing cycle time, and reducing stress relaxation from implant damage. Further, the boron dopants are activated by the epitaxy, thereby eliminating the need for an additional anneal. A slight overgrowth helps to form a more solid encapsulation and margin for subsequent cleans that attack the active open silicon area. The overgrowth further provides extra margin for forming a solid salicide, for example nickel silicide (NiSi), and has better contact resistance.

As illustrated in FIG. 1H, another cleaning step, e.g. using a wet etch, for example with diluted hydrofluoric acid (dHF), will remove oxide hardmask 139 from NMOS 113. Adverting to FIG. 1I, the wet etch is followed by a dry etch or by an additional wet etch, for example employing hot phosphoric acid ($H_3PO_4$), to remove the nitride caps 109 and nitride spacers 133. As shown, this leaves an L-shaped oxide spacers 135 exposed.

Metal, for example nickel (Ni), nickel titanium (NiTi), or cobalt (Co), may then be deposited over the entire device and annealed to form a silicide 145 over source/drain regions 137 and poly-Si 107 (i.e., NiSi, NiTiSi, or CoSi) and over SiGe 143 (i.e., NiSiGe, NiTiSiGe, or CoSiGe), to form low resistance areas. The silicide combined with the SiGe lowers the sheet and contact resistance, thereby improving performance behavior. The process flow then continues with conventional middle-of-line (MOL) processes and contact formation. Alternatively, if L-shaped oxide spacer 135 is too thin at the time of salicidation, e.g. less than 10 nm, for example because of thinning during a preclean prior to depositing the nickel, an additional nitride spacer (SiN salicide protection spacer, not shown for illustrative convenience) must be formed prior to forming the silicide, to increase the silicide distance from the channel region. Then the process may continue with the salicidation as disclosed, and MOL processes and contact formation.

The embodiments of the present disclosure can achieve several technical effects, including improved gate first HKMG encapsulation, thereby improving yield, lower contact resistance, lower serial resistance in the PMOS devices, increased carrier mobility and drive current with lower power in the PMOS devices, increased performance, and lower manufacturing costs. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for 32 nm and 28 nm technologies and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming first and second high-k metal gate (HKMG) gate stacks on a substrate;
   forming a nitride liner and oxide spacers on each side of each of the first and second HKMG gate stacks, such that the nitride liner is in direct contact with the first and second HKMG gate stacks;
   performing halo/extension implants at each side of each of the first and second HKMG gate stacks;
   forming an oxide liner and nitride spacers on the oxide spacers of each of the first and second HKMG gate stacks;
   forming deep source/drain regions at opposite sides of the second HKMG gate stack;
   forming an oxide hardmask over the second HKMG gate stack;
   forming embedded silicon germanium (eSiGe) at opposite sides of the first HKMG gate stack; and
   removing the oxide hardmask.

2. The method according to claim 1, comprising:
   forming the nitride liner of silicon nitride (SiN);
   forming the oxide spacers of SiO2; and
   forming the nitride spacers of SiN.

3. The method according to claim 1, wherein the first and second HKMG gate stacks each further comprises a high-k dielectric, a work function metal, polysilicon (poly-Si), and a SiN cap.

4. The method according to claim 3, further comprising:
   precleaning prior to forming the eSiGe; and
   optimizing the precleaning to protect the SiO2 spacers.

5. The method according to claim 1, comprising:
   forming eSiGe at each side of the first HKMG gate stack by:
   forming a cavity by wet etching with tetramethylammonium hydroxide (TMAH); and
   epitaxially growing SiGe in the cavity.

6. The method according to claim 5, further comprising implanting a boron dopant in-situ into the eSiGe.

7. The method according to claim 6, comprising implanting boron with a graded doping profile.

8. The method according to claim 1, further comprising annealing to activate implanted dopants after forming the oxide hardmask.

9. The method according to claim 1, comprising removing oxide hardmask by wet etching with diluted hydrofluoric acid (dHF).

10. The method according to claim 9, further comprising removing the SiN cap and nitride spacers after removing the oxide hardmask.

11. The method according to claim 10, comprising removing the SiN cap and nitride spacer by a dry or wet etch process.

12. The method according to claim 11, further comprising forming a silicide on the source/drain regions, the eSiGe, and the first and second HKMG gate stacks.

13. The method according to claim 1, further comprising forming a channel SiGe region below the first HKMG gate stack.

14. A method comprising:
forming PMOS and NMOS high-k metal gate (HKMG) gate stacks on a substrate;
forming an L-shaped silicon nitride (SiN) liner and silicon dioxide (SiO2) spacers on each side of each of the PMOS and NMOS HKMG gate stacks, such that the SiN liner is in direct contact with the PMOS and NMOS HKMG gate stacks;
performing halo/extension implants at each side of each of the PMOS and NMOS HKMG gate stacks;
forming an L-shaped SiO2 liner and SiN spacers on the SiO2 spacers of each of the PMOS and NMOS HKMG gate stacks;
implanting deep source/drain regions at opposite sides of the NMOS HKMG gate stack;
forming an SiO2 hardmask over the NMOS HKMG gate stack;
forming embedded silicon germanium (eSiGe) at opposite sides of the PMOS HKMG gate stack by:
 forming a cavity at each side of the PMOS HKMG gate stack by wet etching with TMAH;
 epitaxially growing SiGe in the cavity; and
 implanting a boron dopant, with a graded doping profile, in-situ into the eSiGe concurrently with the epitaxial growth;
wet etching the SiO2 hardmask with diluted hydrofluoric acid (dHF);
dry or wet etching the SiN cap and SiN spacers; and
forming a silicide on the source/drain regions, the eSiGe, and the PMOS and NMOS HKMG gate stacks.

* * * * *